United States Patent
Lee et al.

(10) Patent No.: US 7,031,163 B2
(45) Date of Patent: Apr. 18, 2006

(54) MECHANICAL COOLING FIN FOR INTERCONNECTS

(75) Inventors: Ki-Don Lee, Austin, TX (US); Srikanth Krishnan, Richardson, TX (US); William R. Hunter, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 197 days.

(21) Appl. No.: 10/688,288

(22) Filed: Oct. 17, 2003

(65) Prior Publication Data

US 2004/0125572 A1 Jul. 1, 2004

Related U.S. Application Data

(60) Provisional application No. 60/436,660, filed on Dec. 30, 2002.

(51) Int. Cl.
*H05K 7/20* (2006.01)
*H01L 23/34* (2006.01)

(52) U.S. Cl. ............... 361/718; 361/719; 361/722; 257/713

(58) Field of Classification Search ............... 361/704, 361/707, 714–722; 257/181, 712, 508, 587, 257/675, 701, 706, 758, 707, 718, 720, 713
See application file for complete search history.

(56) References Cited

U.S. PATENT DOCUMENTS

| | | | | |
|---|---|---|---|---|
| 5,338,967 A * | 8/1994 | Kosaki | ............... | 257/620 |
| 5,621,616 A * | 4/1997 | Owens et al. | ............... | 361/704 |
| 5,698,897 A * | 12/1997 | Nashimoto et al. | ......... | 257/712 |
| 5,792,677 A * | 8/1998 | Reddy et al. | ............... | 438/122 |
| 5,896,271 A * | 4/1999 | Jensen et al. | ............... | 361/719 |
| 6,100,199 A * | 8/2000 | Joshi et al. | ............... | 438/694 |
| 6,242,807 B1 * | 6/2001 | Kazami | ............... | 257/758 |
| 6,265,771 B1 * | 7/2001 | Ference et al. | ............ | 257/706 |
| 6,284,574 B1 * | 9/2001 | Petrarca et al. | ............ | 438/122 |
| 6,570,247 B1 * | 5/2003 | Eiles et al. | ................. | 257/707 |
| 6,657,864 B1 * | 12/2003 | Dyckman et al. | ........... | 361/704 |

* cited by examiner

*Primary Examiner*—Anatoly Vortman
(74) *Attorney, Agent, or Firm*—W. James Brady, III; Frederick J. Telecky, Jr.

(57) ABSTRACT

In one embodiment, an integrated circuit includes an electrically active interconnect line within a dielectric layer having a top and bottom surface, the bottom surface of the dielectric layer being coupled to the top surface of a substrate underlying the dielectric layer. The dielectric layer has horizontally arranged heat dissipating layers. An electrically inactive conductor or cooling fin is located within the dielectric layer at a heat dissipating layer below and closer to the substrate than said active interconnect line. The electrically inactive conductor is coupled to said electrically active interconnect line as an extensions of electrically active interconnect line to dissipate heat therefrom.

17 Claims, 4 Drawing Sheets

_US 7,031,163 B2_

MECHANICAL COOLING FIN FOR INTERCONNECTS

This application claims priority under 35 USC §119(e)(1) of provisional application No. 60/436,660 filed Dec. 30, 2002.

FIELD OF INVENTION

This invention relates to integrated circuits and more particularly to an integrated circuit providing thermally conductive electrically inactive extensions to active interconnect lines to reduce localized Joule heating in interconnect lines.

BACKGROUND OF INVENTION

Typical semiconductor devices comprise multiple circuits formed within a dielectric region comprised of one or more dielectric layers on top of a silicon substrate or wafer. On top of the substrate are layers of dielectric and layers of metal and layers of metal embedded in dielectric. When the metal interconnect leads of the circuits are on different layers, conductive vias extend through the dielectric layers to make connections between the wiring leads on different interconnect levels. Sometimes, based on the circuit design, a significantly large amount of current may flow through the metal interconnect leads, causing Joule heating to increase the temperature of the metal leads. The current flowing through these leads may cause sufficient Joule heating to increase the temperature of the leads. Such temperature increases may accelerate reliability wearout mechanisms such as electromigration and stress migration that might possibly lead to failure of the integrated circuit. It is common practice to widen leads that have current densities in excess of those required for reliable operation. However, widening leads may have a deleterious impact on the area of the integrated circuit.

Current trends in integrated circuit design include using dielectric materials of increasingly low thermal conductivity, exacerbating the deleterious effects of Joule heating within the integrated circuit. In addition, as integrated circuit technologies are scaled, the number of layers of metal interconnect is increasing, making it increasingly difficult to dissipate heat from metal leads. Furthermore, integrated circuits that draw relatively large amounts of power may intensify the increases in temperature in the integrated circuit due to Joule heating effects.

During fabrication of integrated circuits, dummy metal structures may be inserted in the integrated circuit to increase the density of metal structures on the top surface of the integrated circuit. For example, insertion of dummy metal structures may lead to improved pattern consistency of metal leads and to reduced "dishing" during chemical mechanical polishing (CMP) of the integrated circuit. It is common practice to use dummy metal structures during the fabrication of integrated circuits. Because metals are much better thermal conductors than are dielectrics, the presence of dummy metal structures surrounding regions where the temperatures of metal leads may become excessive can contribute to heat flow away from such interconnect region toward heat sinking regions, thereby resulting in lower temperatures of the metal leads. Vertical vias may be formed within the dielectric layer between dummy metal structures and filled with a thermally conductive material to provide direct thermal connections between dummy metal structures. Although this may help dissipate heat from metal leads or other heat generating structures, such techniques may still be inadequate for integrated circuit applications. An integrated circuit with such heat conductive structures is described in co-pending patent application of Hunter et al. entitled "Integrated Circuit Providing Thermally Conductive Structures Substantially Horizontally Coupled To One Another Within One or More Heat Dissipation Layers To Dissipate Heat From A Heat Generating Structure", Ser. No. 10/326,612 filed Dec. 20, 2002. This application is incorporated herein by reference.

SUMMARY OF INVENTION

According to an embodiment of the present invention, electrically inactive extensions of electrically active interconnect leads are fabricated. The term electrically inactive as used herein means that they are not connected to anything else, and therefore do not conduct any nominal current. The purpose of these electrically inactive extensions are to more efficiently conduct heat to regions of the integrated circuit design where heat can flow to heat sinking regions of the integrated circuit, such as the substrate upon which the integrated circuit is fabricated. Each extension can be thought of as a micro-miniature thermal cooling fin. The position of each thermal cooling fin can be optimized with respect to it size and nearness to the substrate and to other dummy metal structures.

DESCRIPTION OF PREFERRED EMBODIMENT

Figure 1:
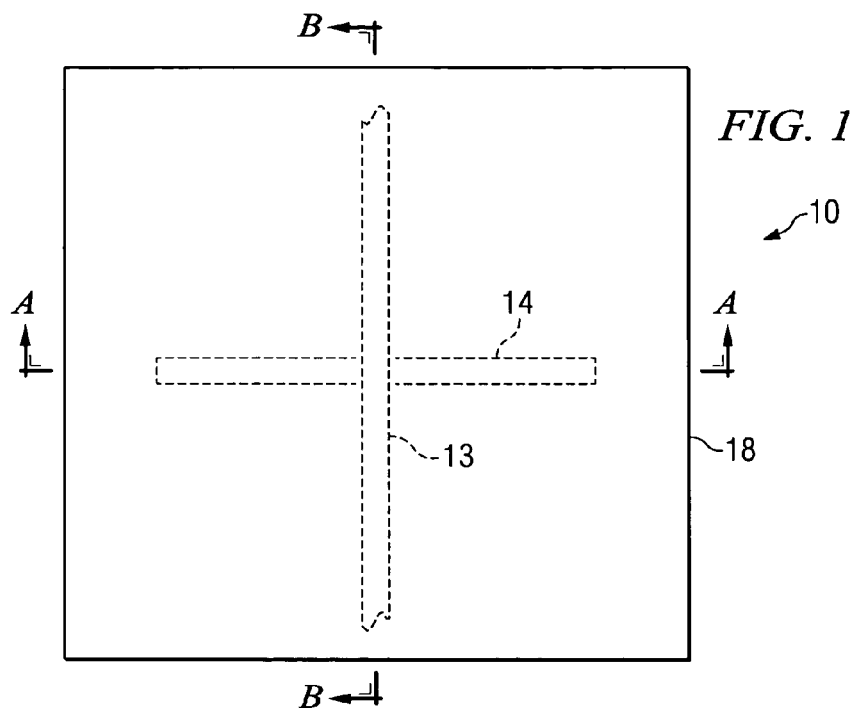
FIG. 1 illustrates a top plan view of embodiments described in connection with FIGS. 2–7 of the present invention of an electrically active line and an electrically inactive cooling fin.
Figure 2:
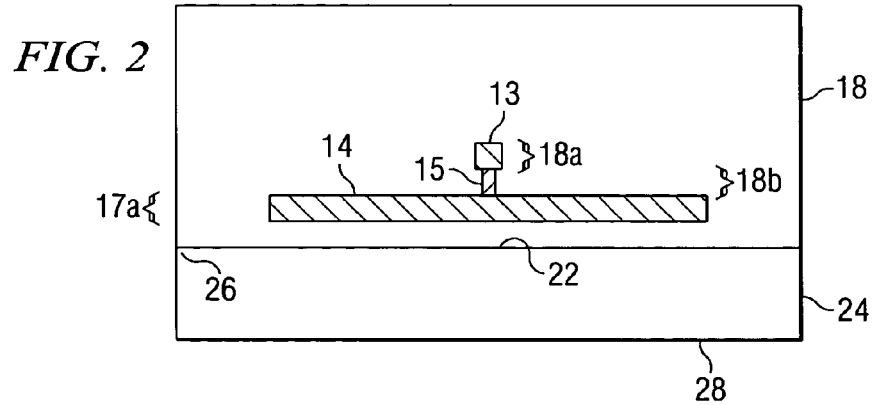
FIG. 2 illustrates a cross section of FIG. 1 taken through A—A for one embodiment of the present invention.
Figure 3:
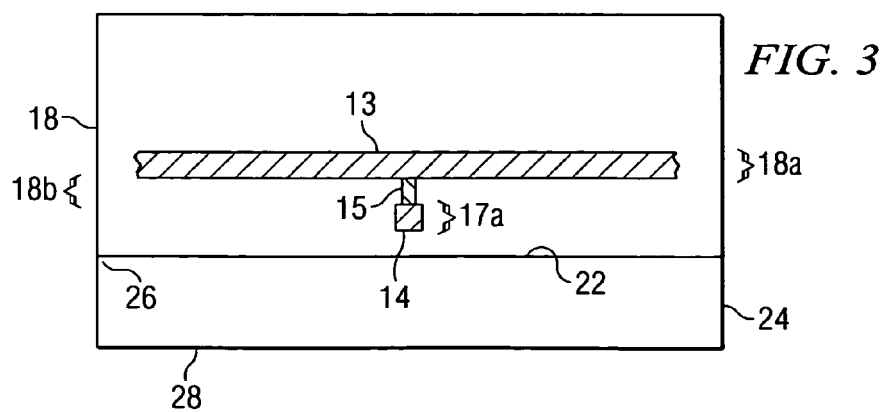
FIG. 3 illustrates a cross section of FIG. 1 taken through B—B for the embodiment of FIG. 2.

FIGS. 1–3 shows one embodiment of the present invention for reducing the temperature rise due to Joule heating. FIG. 1 is a top plan view of the integrated circuit 10 according to embodiments of the present invention described in connection with FIGS. 2–7. FIG. 2 is a cross section taken though A—A in FIG. 1 and FIG. 3 is an orthogonal cross section taken through B—B in FIG. 1. The integrated circuit 10 includes an integrated circuit substrate 24 of silicon, for example, having a top surface 26 and bottom surface 28 and dielectric body 18 above the substrate 24 with a bottom surface 22 adjacent with the top surface 26 of the substrate 24. The dielectric body 18 may include silicon dioxide, silicon nitride, or other suitable dielectric material. The dielectric body 18 comprises multiple layers of heat generating leads or other structures embedded within the dielectric body 18, such as an electrically active current carrying metal lead 13 in layer 18a. The metal lead 13 is represented by dashed lines in FIG. 1 since the lead 13 is in a layer 18a below the top surface of the dielectric body. The heat generating electrically active current carrying metal lead may include copper, aluminum tungsten, or other suitable metal or metal alloy. The dielectric body 18 has at least one of its two surfaces—top and bottom—thermally coupled to an external heat sink by virtue of its packaging details. The heat dissipating surface can be either a bottom silicon substrate connected by bonding to a package or a top surface of an integrated circuit package. For simplicity, we will refer to the case where heat flow is through the bottom surface 22 connection to the integrated circuit substrate 24 at the top surface 26, although it is understood that the invention applies to the case where the other or both surfaces are thermally coupled to heat sinks. There should be external heat sinks, as part of the details of integrated circuit packaging and the mounting of packages in the systems.

In accordance with one embodiment of the present invention thermal cooling conductor or fin 14 is located in a substantially horizontal region or layer 17a in the dielectric body 18 below an interconnect connector 13 layer 18a. This cooling fin is represented by dashed lines in FIG. 1 since this is also below the top surface. The cooling fin 14 is physically connected to the electrically active interconnect conductor 13 to help dissipate the heat generated in the electrically active interconnect conductor 13. This cooling fin 14 in layer 17a provides an enhanced heat dissipating layer. The thermal cooling conductor or fin 14 includes electrically inactive metal conductor such as a straight heat conductive line 14 physically connected by a connecting conductor via 15 extending in layer 18b between layers 18a and 17a of dielectric body 18 to the electrically active interconnect lead 13 in which Joule heating is being generated. Only a portion of the electrically active interconnect lead 13 is shown in the FIGS. 1–3.

The electrical inactivity of cooling fin 14 means that it is not connected to any other portion of electrically active interconnect, and therefore does not carry any intentional current. It is also to be understood that the shape of the cooling fin 14 does not have to be a straight line. It is also to be understood that the cooling fin 14 does not have to be constrained to a specific size. It can be any shape and size that is convenient while considering the tradeoffs between impact on circuit layout, circuit performance, and thermal management.

This above described arrangement is a preferred embodiment because it places the cooling fin 14 as close as possible to the heat sinking substrate 24, thereby optimizing heat loss from the active metal. Alignment with other electrically inactive metal structures, such as dummy metal, may also optimize heat loss and consequent temperature reduction.

In the case where the dominant heat sink direction is above the dielectric body 18 or for other reasons, the electrically inactive cooling fin 14 or enhanced dissipating layer would be in a layer of the dielectric body 18 above the electrically active interconnect line 13 and the placement of the elements in FIGS. 1–3 would be reversed with fin 14 closer to the top of the dielectric body 18 where the top heat sink is located in the place of active interconnect line 13 in FIGS. 2 and 3 and the location of the interconnect line 13 would be below the fin 14 and in the place of fin 14 in FIGS. 2 and 3.

Figure 4:
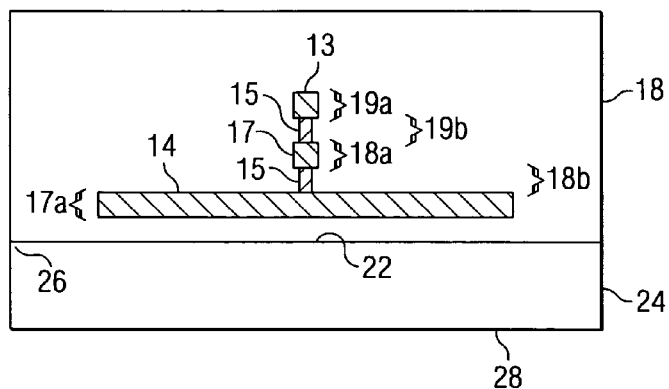
FIG. 4 illustrates a cross section taken through A—A of FIG. 1 wherein the electrically inactive cooling fin is positioned multiple layers below the electrically active line.
Figure 5:
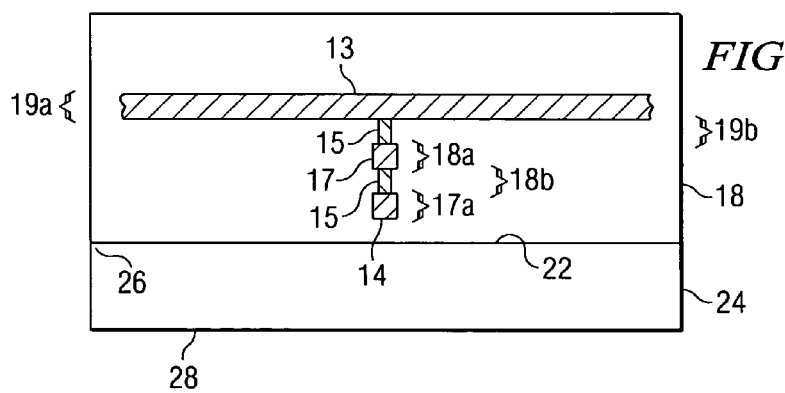
FIG. 5 illustrates a cross section taken through B—B of FIG. 1 wherein the electrically inactive cooling fin is positioned multiple layers below the electrically active line.

In general, the electrically active interconnect lead can be connected to a cooling fin or electrically inactive line which is on one dielectric layer or level of the dielectric body 18 above or below the level of electrically active interconnect line to provide an enhanced heat dissipating layer or structure by the fin or electrically inactive line in the dielectric body. Whether it is above or below depends on whether the dominant heat sinking direction is above or below the dielectric body 18, respectively. As an example, in the case where the dominant heat sinking direction is through the substrate 24, there may be multiple vias 15 between the electrically active interconnect lead 13 and the inactive cooling fin 14 as illustrated in FIGS. 4 and 5. FIGS. 4 and 5 are cross sections of FIG. 1 taken at planes A—A for FIG. 4 and plane B—B for FIG. 5. The connection between the two vias 15 may include a conductive pad or block 17 at layer 18a. The closer the cooling fin 14 can be placed to the heat sinking substrate 24 for example the more optimal will be the temperature reduction of the electrically active lead. If on the other hand the heat sinking surface is at the top, the closer to the top the better.

Figure 6:
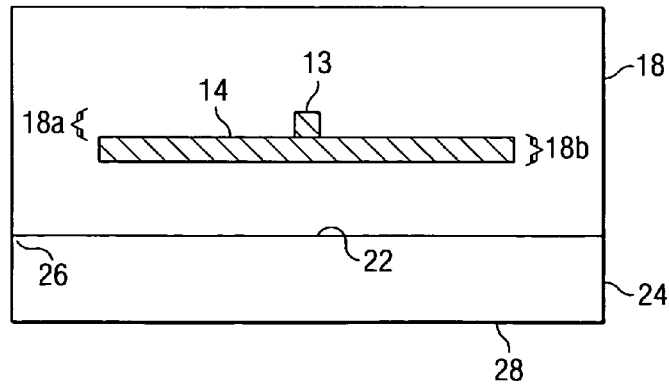
FIG. 6 illustrates a cross section view of FIG. 1 taken through A—A wherein the cooling fin is on the on the same surface as the via in FIGS. 2 and 3.

In accordance with another embodiment of the present invention, the electrically inactive heat dissipating cooling fin 14 is built in the same layer 18b as was the via 15 in FIG. 1–3, by extending the normal via pattern to have an extended via shape. This is illustrated in FIG. 6 for the case where the electrically inactive cooling fin 14 is below the electrically active interconnect lead 13 in the same plane as the via 15 in FIGS. 1–3. FIG. 6 illustrates the A—A cross section of FIG. 1. The thermal cooling fin 14 may be formed in the surrounding dielectric layer 18b during the same single damasene process as is the via 15 in FIGS. 1–3, wherein holes are formed in the surrounding dielectric layer 18b and filled with copper and then polished off to the surface of the dielectric layer. It is to be understood that the cooling fin 14 could also have been fabricated above the electrically active interconnect lead 13.

Figure 7:
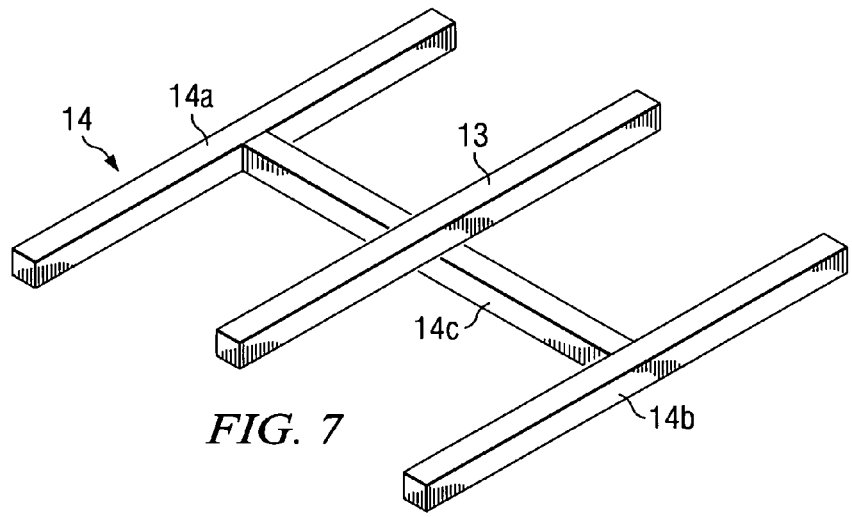
FIG. 7 illustrates a perspective view of the case where the mechanical cooling fin or inactive conductive conductor is in the shape of an "H" and is in the same heat dissipating layer as the via in FIG. 2 and FIG. 3 for a single damascene process.

The shape of the cooling fin 14 may be other than a straight line and as shown by the perspective view in FIG. 7 to provide the cooling surface. Any shape consistent with via design rule constraints could be patterned. In FIG. 7 the electrically inactive cooling fin 14 extends out in the shape of an "H" with two conductors 14a and 14b parallel to the interconnect line 13 and a cross connective and conductive bar 14c orthogonal and connected to conductors 14a and 14b, with the cross bar 14c across the interconnect lead 13 and connected thereto. Heat flow from the line 13 to the fin occurs in the overlap region between the line 13 and the crossbar 14c, where the two layers are in contact. The extension of the interconnect line 13 in FIG. 7 is not solid so as to illustrate the fin 14.

In accordance with another embodiment of the present invention, the electrically inactive heat dissipating cooling fin 14 is built in the same layer as the electrically active interconnect line 13 and is in fact a heat dissipating stub connection off the active line. The shape can be other than a straight line. It can, in the most general embodiment, be any arbitrary shape which does not interfere nor come in contact with any other intentionally routed metal interconnect lines or substrate used to achieve circuit functionality. The fins have to be designed so as not to interfere with the other electrical lines, and in a manner that has acceptable parasitic capacitance.

Figure 8:
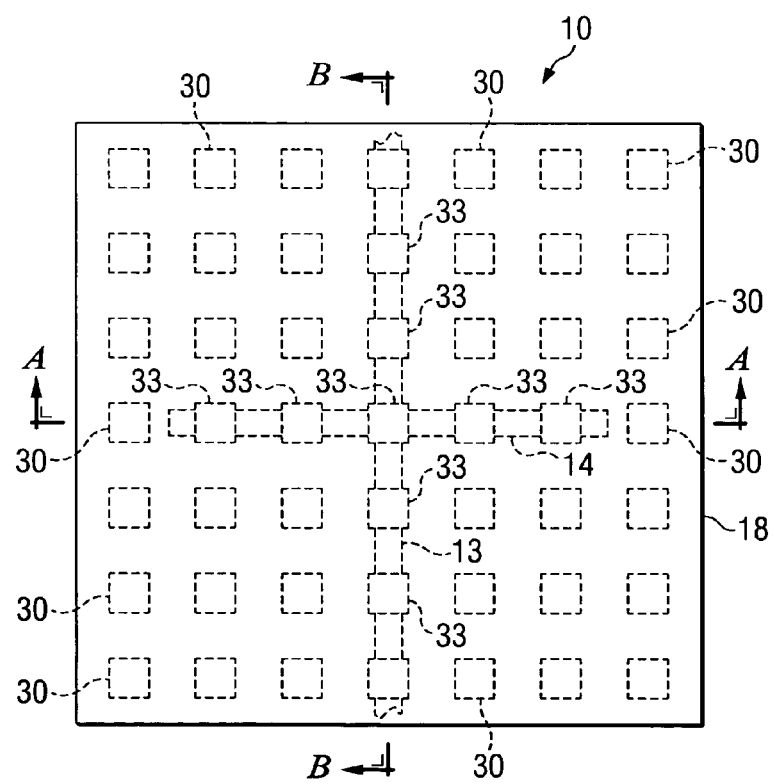
FIG. 8 illustrates a top plan view of an embodiment described in connection with FIGS. 9–10 of the present invention of an electrically active line and an electrically inactive cooling fin with dummy metal structures.
Figure 9:
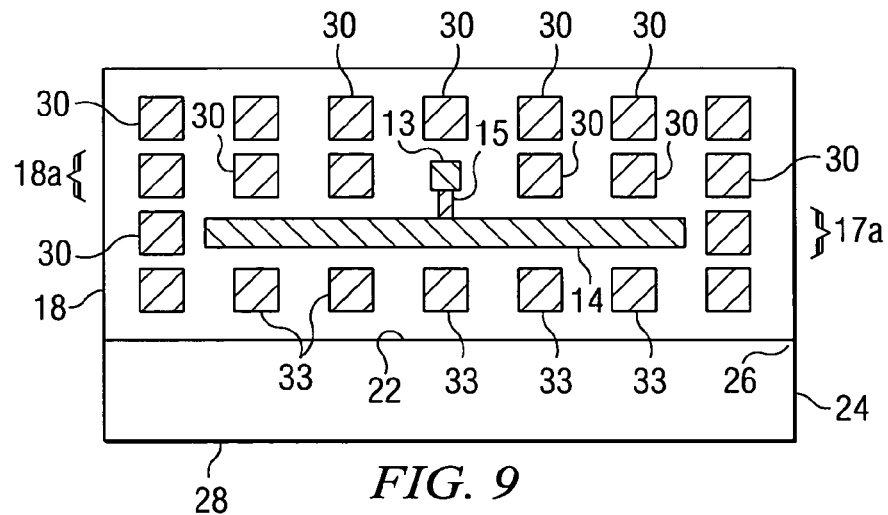
FIG. 9 illustrates a cross section taken through A—A of FIG. 8 wherein the dielectric region contains layers of dummy metal and the electrically inactive cooling fin is aligned to overlay on top of underlying dummy metal in accordance with another embodiment of the present invention.
Figure 10:
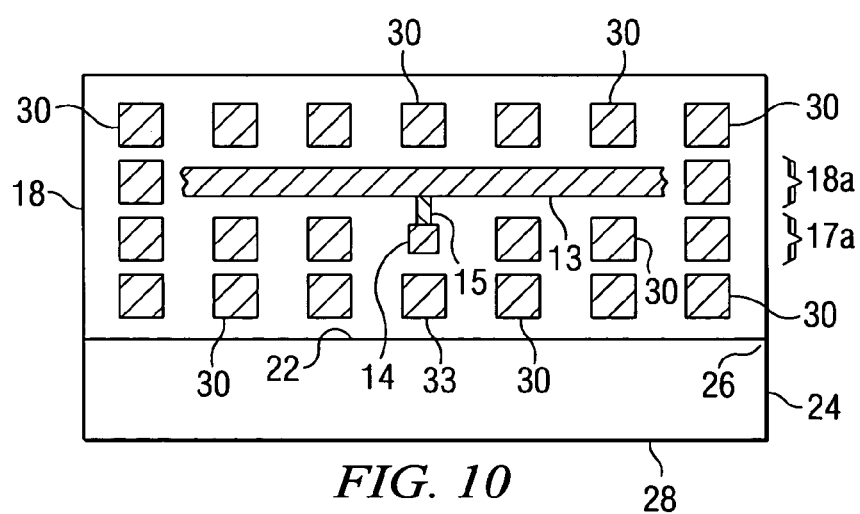
FIG. 10 illustrates a cross section taken through B—B of FIG. 8 wherein the dielectric region contains layers of dummy metal and the electrically inactive cooling fin is aligned to overlay on top of underlying dummy metal in accordance with the same embodiment of the present invention as FIG. 9.

The presence of dummy metal structures increases the conductivity of heat to the substrate 11 and a heat sink. The electrically inactive cooling fin may be lines up with dummy metal structures 33 as illustrated in FIGS. 8, 9 and 10. In FIGS. 8 and 9 the electrically inactive cooling fin 14 extends along several dummy metal structures 33 below the cooling fin that aid in the conduction of the heat to the substrate 24. In FIG. 8 these dummy metal structures 33 are represented by dashed lines because they are below and aligned with the upper dummy metal structures 30 and the cooling fin 14. In FIG. 10 the electrically inactive cooling fin 14 is lined up with a dummy metal structure 33 that is located between the cooling fin and the substrate 24.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

The invention claimed is:

1. A method of dissipating heat in an electrically active interconnect line in an integrated circuit comprising the steps of:
   providing an enhanced heat dissipating structure comprising a continuous electrically inactive conductor extending in one or more heat dissipating layers of a dielectric body dielectrically spaced from and along a heat dissipating substrate and
   connecting said electrically inactive conductor to said electrically active interconnect line as an extension of said electrically active interconnect line to dissipate heat from said electrically active interconnect line through said enhanced heat dissipating layers of dielectric body.

2. The method of claim 1 wherein said electrically inactive conductor is on one or more layers of said dielectric body forming one or more enhanced heat dissipating layers and these heat dissipating layers are closer to a heat dissipating substrate than said electrically active interconnect line.

3. The method of claim 2 wherein said electrically inactive conductor is connected to said electrically active interconnect line using one or more vias through said one or more layers of said dielectric body.

4. The method of claim 3 wherein said electrically inactive conductor is connected to said electrically active interconnect line using at least two vias and a conducting pad through two or more layers of said dielectric body.

5. The method of claim 2 wherein said dielectric body includes dummy metal structures and said electrically inactive conductor is spaced from and aligned with one or more of said dummy metal structures to aid in dissipating heat from said electrically inactive conductor.

6. The method of claim 5 wherein said dummy metal structures is in said dielectric body between said electrically inactive conductor and said heat dissipating substrate.

7. The method of claim 2 including the step of coupling said heat dissipating substrate to a heat sink.

8. The method of claim 1 wherein said electrically inactive conductor is in a straight line.

9. The method of claim 1 wherein said electrically inactive conductor is not in a straight line.

10. The method of claim 9 wherein said electrically inactive conductor is in the shape of an H with two parallel conductors and a cross connector connected to the electrically active connector.

11. The method of claim 10 wherein in said connecting step said electrically inactive conductor is in a heat dissipating dielectric layer of said dielectric body adjacent to said electrically active conductor and wherein said electrically inactive conductor and a via connection to the electrically inactive conductor is formed by a damascene process.

12. An integrated circuit, comprising:
   an electrically active interconnect line within a dielectric body having a top and bottom surface, the bottom surface of the dielectric body being coupled to the top surface of a heat dissipating substrate underlying the dielectric body; and
   an electrically inactive continuous conductor within said dielectric body at one or more layers of said body closer to the heat dissipating substrate than said active interconnect line with dielectric material separating the inactive conductor from said heat dissipating substrate; said electrically inactive conductor coupled to said electrically active interconnect line as an extensions of electrically active interconnect line to dissipate heat therefrom.

13. The integrated circuit of claim 12 wherein said electrically inactive conductor is connected to said electrically active interconnect line using one or more vias through one or more layers of said dielectric body.

14. The integrated circuit of claim 13 wherein said electrically inactive conductor is connected to said electrically active interconnect line using at least two vias and a conducting pad through two or more layers of said dielectric body.

15. The integrated circuit of claim 13 wherein said dielectric body includes dummy metal structures in one or more layers of said dielectric body and said electrically inactive conductor is aligned with and spaced from one or more of said dummy metal structures to aid in dissipating heat from said electrically inactive conductor.

16. The integrated circuit of claim 15 wherein said dummy metal structures in said dielectric body is between said electrically inactive conductor and said substrate.

17. The integrated circuit of claim 12 including means for coupling said heat dissipating substrate to a heat sink.

* * * * *